US007002395B2

(12) United States Patent
Gamble

(10) Patent No.: US 7,002,395 B2
(45) Date of Patent: Feb. 21, 2006

(54) DEMODULATING LOGARITHMIC AMPLIFIER

(75) Inventor: Kevin Gamble, Fort Lauderdale, FL (US)

(73) Assignee: Yuantonix, Inc., Hsinchu (TW)

( * ) Notice: Subject to any disclaimer, the term of this patent is extended or adjusted under 35 U.S.C. 154(b) by 0 days.

(21) Appl. No.: 10/935,493

(22) Filed: Sep. 7, 2004

(65) Prior Publication Data
US 2005/0057297 A1 Mar. 17, 2005

Related U.S. Application Data

(63) Continuation-in-part of application No. 10/663,393, filed on Sep. 16, 2003, now abandoned.

(51) Int. Cl.
G06F 7/556 (2006.01)
(52) U.S. Cl. ........................ 327/350; 327/351; 327/352
(58) Field of Classification Search ........ 327/350–354, 327/358, 359, 560–563, 361, 103
See application file for complete search history.

(56) References Cited

U.S. PATENT DOCUMENTS

| 4,972,512 | A | * | 11/1990 | Garskamp | ................... 455/341 |
| 4,990,803 | A | | 2/1991 | Gilbert | |
| 5,298,811 | A | | 3/1994 | Gilbert | |
| 5,319,264 | A | | 6/1994 | Kimura | |
| 5,467,046 | A | * | 11/1995 | Kimura | ...................... 327/351 |
| 5,521,542 | A | | 5/1996 | Kimura | |
| 5,561,392 | A | | 10/1996 | Kimura | |
| 5,570,055 | A | | 10/1996 | Gilbert | |
| 5,631,594 | A | | 5/1997 | Kimura | |
| 5,677,561 | A | | 10/1997 | Jensen | |
| 5,805,011 | A | | 9/1998 | Comino | |
| 5,838,510 | A | | 11/1998 | Inbar | |
| 6,144,244 | A | | 11/2000 | Gilbert | |
| 6,559,705 | B1 | * | 5/2003 | Kohsiek | ...................... 327/352 |
| 6,590,437 | B1 | * | 7/2003 | Imai | ........................... 327/350 |
| 6,734,712 | B1 | * | 5/2004 | Haslett et al. | .............. 327/350 |
| 6,750,715 | B1 | * | 6/2004 | Allott et al. | ................. 330/258 |
| 2002/0101275 | A1 | | 8/2002 | Imai | |

* cited by examiner

Primary Examiner—Timothy P. Callahan
Assistant Examiner—Hai L. Nguyen
(74) Attorney, Agent, or Firm—Larson & Associates, P.C.; Michelle Lavaque

(57) ABSTRACT

A demodulating logarithmic amplifier rectifies a radio frequency signal prior to amplification through progressive stages. A full wave linear or squaring rectifier receives a waveform signal at the input and provides a rectified signal that is proportional to an envelope or a square of the envelope of the waveform signal at the output. The rectified signal is then fed to a series of limiting amplifier stages where the signal is progressively amplified. After each individual amplifier stage, the partially amplified signal is passed through a voltage-to-current converter to create a current signal. All the current signals are subsequently summed to produce an amplified current output signal that is representative of the logarithm of the envelope of the input signal.

13 Claims, 3 Drawing Sheets

DEMODULATING LOGARITHMIC AMPLIFIER

CROSS REFERENCE TO RELATED DOCUMENTS

This application is a continuation-in-part claiming priority benefit of U.S. patent application Ser. No. 10/663,393, filed Sep. 16, 2003 now abandoned, entitled "Demodulating Logarithmic Amplifier and Method of Amplification", which is hereby incorporated herein by reference.

FIELD

This invention relates generally to demodulating logarithmic amplifiers, and, more particularly, to a multi-stage logarithmic amplifier of the "progressive-compression" type.

BACKGROUND

In order to maximize the network capacity and mobile terminal battery life, cellular telephones must accurately control the transmitted radio frequency (RF) power over a dynamic range of 30 dB or more. This is accomplished by controlling the power amplifier (PA) in the cellular telephone using a 'closed loop' method to continually adjust the gain control of the PA based on an integration of the error signal between a reference current, and a power detector (PD) output. A logarithmic power detector (LPD) provides a current or voltage output that is a linear function of the input power. The operation of a LPD is based on a gain curve that is an approximation to the logarithm function. This 'logarithmic' approximation is generally accomplished through the amplification of an input voltage signal by a chain of limiting amplifiers. The output of each gain stage is then converted into a current, rectified, and summed with the rectified outputs of the remaining stages. This forms the 'demodulated' output, in that the DC output current of the LPD is proportional to the logarithm of the signal envelope. This technique of generating the logarithmic gain function is known as 'successive compression' or 'progressive-compression'. Progressive-compression type logarithmic amplifiers synthesize a logarithmic function through progressive compression of the input signal over many amplifier stages. Each amplifier stage has a relatively low linear gain (typically two to four) up to some critical level. Above the critical level the incremental gain of the amplifier stage is reduced, and in some cases is zero. In demodulating logarithmic amplifiers, the input signal is typically an RF signal, and the output is a signal that is proportional to the logarithm of the input signal envelope.

Referring now to FIG. 1, prior art demodulating logarithmic amplifiers typically include a number of serially coupled amplifier stages 14, a number of linear transconductance or voltage-to-current converter elements 16, and a number of full-wave rectifier cells 15. The transconductance stages are coupled to the output of each amplifier, as well as an initial, transconductance stage 16a coupled to the input of the first amplifier 14a. The output from each transconductance stage is input into a full-wave rectifier, and the output current from each rectifier is summed on a current bus 18. This summed current is then converted from a current into a voltage by a resistor at the output 19.

The challenge in utilizing the demodulating logarithmic amplifier in FIG. 1 as a logarithmic power detector in a cellular handset is that it must operate predictably over a wide range of power amplifier (PA) carrier frequencies and output powers ($\geq$50 dB dynamic range). For example, in a tri-mode GSM mobile station, the PA module must operate at carrier frequencies in the vicinities of 900 MHz (GSM), 1.8 GHz (DCS), and 1.9 GHz (PCS). Over this wide range of frequencies and output powers, the power control loop (and therefore the LPD) must track the envelope fluctuations of the PA output so as to maintain an absolute power accuracy dictated by the appropriate governing standard. The shortcoming for the LPD in FIG. 1 is that in order to track the envelope fluctuations (and therefore the power) of the PA output signal, each of the components in FIG. 1 must be designed to operate at the appropriate RF carrier frequency. If the LPD in FIG. 1 is to be used for all three bands, it becomes necessary to maintain the required voltage gain within each amplifier cell over an extremely wide bandwidth. In addition, the voltage-to-current converters 16 and the rectifiers 15 in FIG. 1 must also be very fast. These high gain-bandwidth components can be so stringent that the device must be fabricated using very expensive semiconductor processes. A need exists for a demodulating logarithmic amplifier that is less complex, uses fewer components, and that can be manufactured at a lower cost.

BRIEF DESCRIPTION OF THE DRAWINGS

The features of the invention believed to be novel are set forth with particularity in the appended claims. The invention itself however, both as to organization and method of operation, together with objects and advantages thereof, may be best understood by reference to the following detailed description of the invention, which describes certain exemplary embodiments of the invention, taken in conjunction with the accompanying drawings in which:

DETAILED DESCRIPTION

Figure 1:
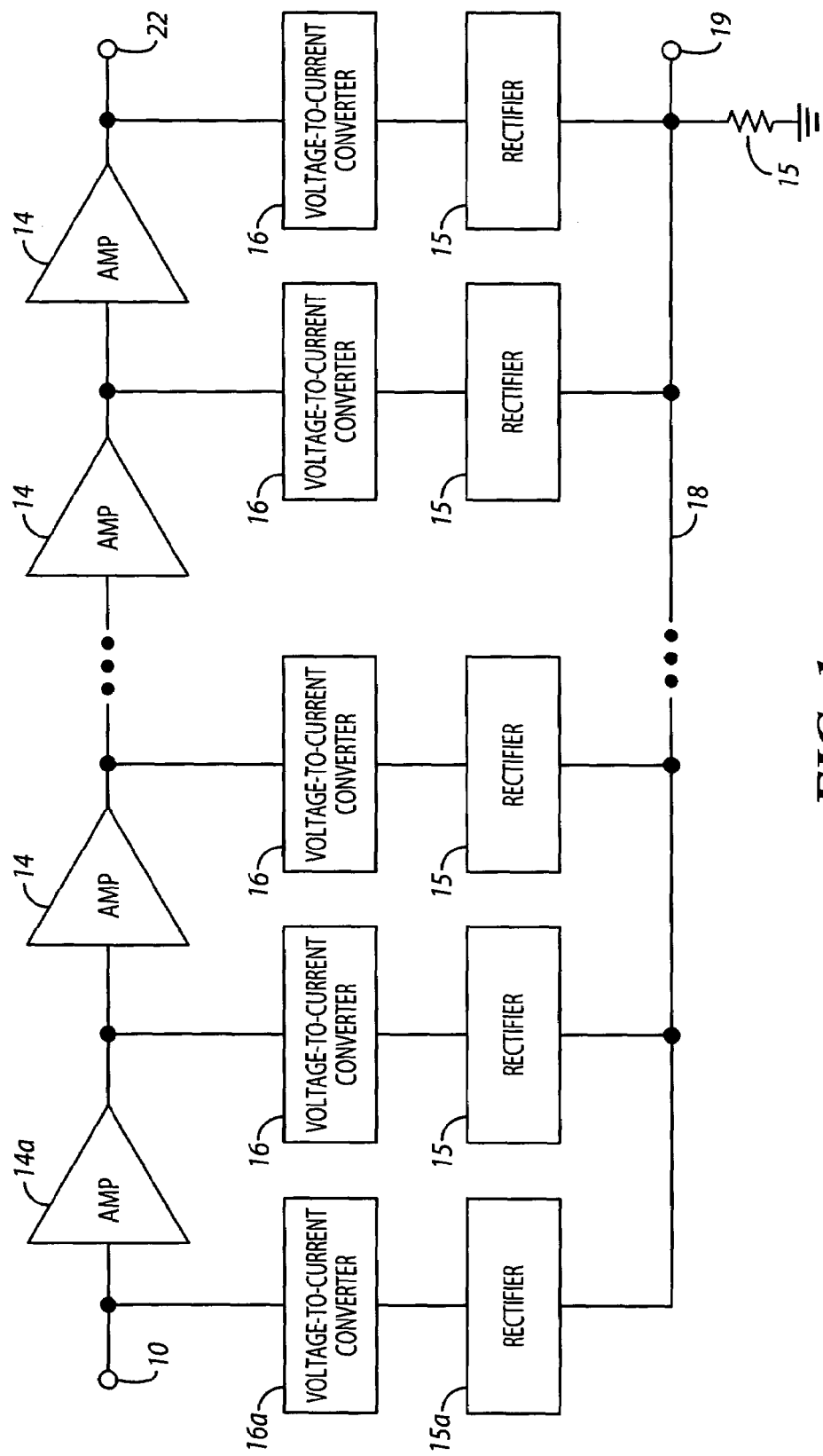
FIG. 1 is a schematic diagram of a prior art demodulating logarithmic amplifier.

While this invention is susceptible of embodiment in many different forms, there is shown in the drawings and will herein be described in detail specific embodiments, with the understanding that the present disclosure is to be considered as an example of the principles of the invention and not intended to limit the invention to the specific embodiments shown and described. In the description below, like reference numerals are used to describe the same, similar or corresponding elements in the several views of the drawings. The terms a or an, as used herein, are defined as one or more than one. The term plurality, as used herein, is defined as two or more than two. The term another, as used herein, is defined as at least a second or more. The terms including and/or having, as used herein, are defined as comprising (i.e., open language). The term coupled, as used herein, is defined as connected, although not necessarily directly, and not necessarily mechanically.

A demodulating logarithmic amplifier rectifies a radio frequency signal prior to amplification through progressive stages. A full wave linear or squaring rectifier receives a waveform signal at the input and provides a rectified signal that is proportional to an envelope or a square of the envelope of the waveform signal at the output. The rectified signal is then fed to a series of limiting amplifier stages where the signal is progressively amplified. After each individual amplifier stage, the partially amplified signal is passed through a voltage-to-current converter to create a current signal. All the current signals are subsequently summed to produce an amplified current output signal. Signal rectification is performed in its entirety before the introduction to the successive compression logarithmic amplifier. This mitigates the need for high gain bandwidth components, and thus allows product fabrication using less expensive semiconductor technologies.

Figure 2:
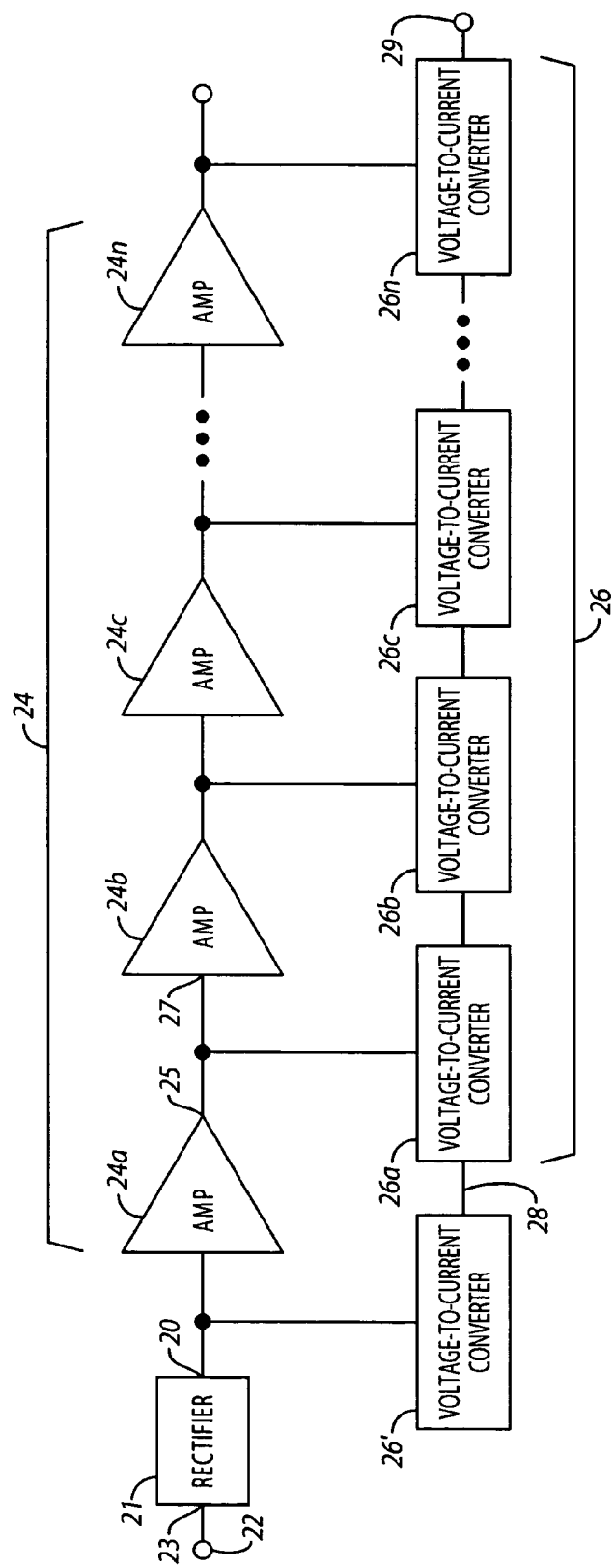
FIG. 2 is a schematic diagram of a logarithmic amplifier consistent with certain embodiments of the invention.

Referring now to FIG. 2, a schematic diagram of one embodiment of a logarithmic amplifier in accordance with the invention includes a full wave linear or squaring rectifier 21 that receives a waveform signal 22 at its input 23 from a radio or cellular telephone or the like. Since the rectifier is the first component in the logarithmic amplifier, it must operate over the full dynamic range of the system (>50 dB). If the waveform signal 22 is a GMSK waveform, then the signal output 20 from the rectifier will consist of a direct current (DC) quantity with harmonics at multiples of two times the frequency of the waveform signal. The rectifier 21 converts the waveform signal 22 into a signal that is proportional to an envelope of the waveform signal, or in the case of a squaring cell, proportional to the square of an envelope of the waveform signal. This DC signal is then fed to a number of limiting amplifier stages 24 that are coupled to each other in serial fashion, that is, the output 25 of a first amplifier 24a is coupled to the input 27 of a second amplifier 24b, the output of the second amplifier is coupled to the input of a third amplifier 24c, and so on. In practice, at least two limiting amplifier stages are used, preferably more, with the total number of amplifier stages being defined as "N" where N is an integer greater than two. At each amplifier stage, the DC voltage signal is amplified by a certain amount, within the capability of the individual amplifier, and then the amplified signal is further amplified by the next amplifier in the chain, through the "Nth" amplifier, to create an amplified voltage signal that is much larger than the input signal 20. In addition to the limiting amplifier stages 24, the logarithmic amplifier includes a plurality of voltage-to-current converter stages 26, which operate as transconductance stages. The number of voltage-to-current converter stages 26 equals the number of amplifier stages 24. The input of each voltage-to-current converter 26a, 26b, . . . 26n is coupled to the output of a corresponding amplifier stage 24a, 24b, . . . 24n, and the outputs of each of the voltage-to-current converter stages 26 are coupled together on a summing bus 28 to form the logarithmic amplifier output 29. If the output of the rectifier 21 is either linear or quadratic over the entire dynamic range of interest, then all of the voltage-to current converters 26a, 26b, . . . 26n can be identical, that is, they can have the same values. (By the term 'values', I mean the constant of proportionality relating the voltage to current conversion. To illustrate, a voltage-to-current converter can be designed such that an input voltage of, say one millivolt, is converted to one milliamp. A voltage-to-current converter with a different value would convert that same 1 millivolt signal to an output current of, perhaps, 5 milliamps. And still another would convert that same 1 millivolt signal to an output current of 28 milliamps, etc., etc.) However, the limits of present day technology dictate that rectifier outputs are not ideally linear or ideally quadratic over wide ranges of input amplitudes and carrier frequencies, and thus, a means of compensating for this non-ideal behavior must be provided. In one embodiment of my invention, the values of each of the voltage-to-current converters 26a, 26b, . . . 26n are different. In another embodiment, only two of the plurality of voltage-to-current converters 26a, 26b, . . . 26n are different, while some of the remaining values can be the same. The ability to customize the values of each of the various voltage-to-current converters allows one to compensate for the non-ideal operation of the rectifier 21, and thus, to provide a high-frequency demodulating logarithmic amplifier that has a log-linear output over a very wide input dynamic range.

An alternate embodiment includes an additional voltage-to-current converter stage 26' to extend the dynamic range and provide for greater accuracy in synthesizing the logarithm function, coupled directly to the output 20 of the rectifier 21, and the output of the converter is coupled to the current summing bus 28 to provide an amplified current output signal 29.

Figure 3:
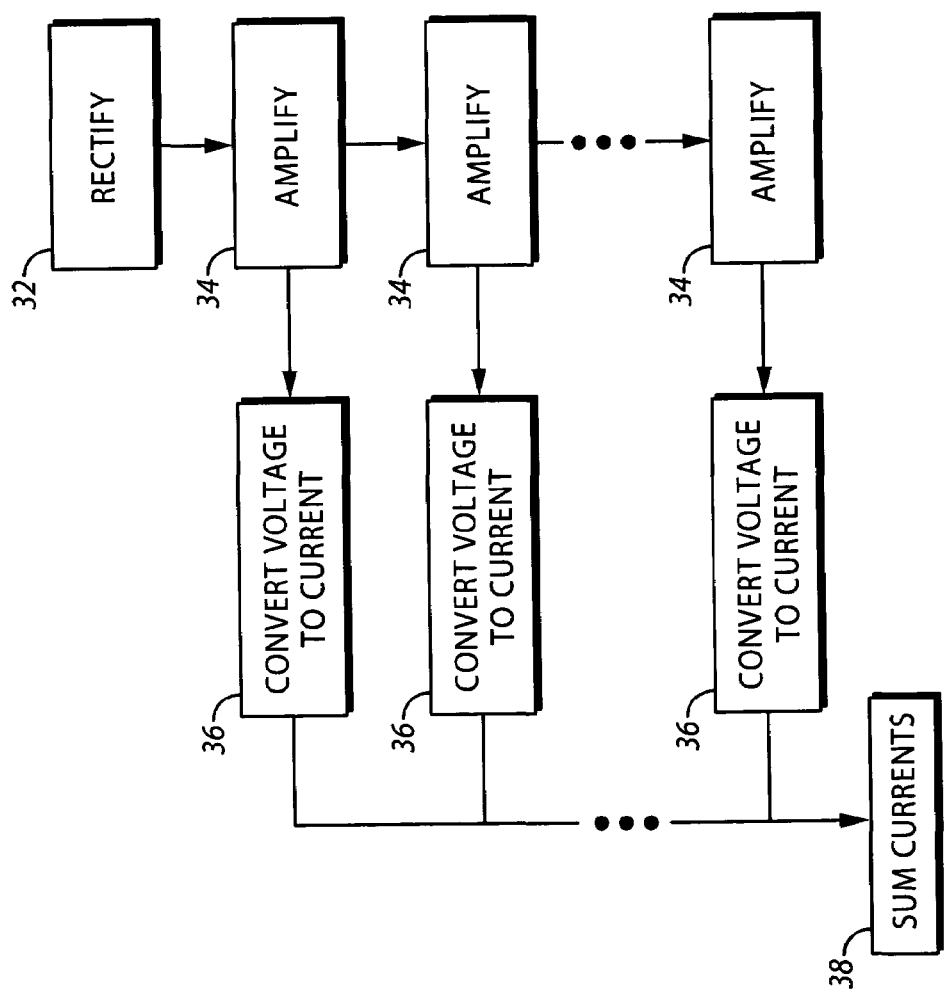
FIG. 3 is a flowchart in accordance with a method of the invention.

Referring now to FIG. 3, the waveform signal is rectified 32 by a means for rectifying such as a linear full wave rectifier or a squaring cell. The rectifier converts the full wave signal into a signal that is proportional to an envelope of the full wave signal, or to the square of the envelope of the full wave signal. The rectified signal is then sequentially amplified 34 by a plurality of serially coupled amplifying means such as a gain amplifier that operates to amplify the input voltage. Typically, the amplifying means amplifies the input voltage with a gain that is constant despite temperature changes. After each of the sequential amplifications steps 34, the partially amplified signal is then converted 36 from a voltage to a current by a converting means coupled to each of the respective amplifying means. All of the current signals are then summed up 38 by a means for summing such as a current summing bus to provide an amplified current output.

Unlike prior art devices, the bandwidth of the voltage-to-current converter stages 26 and the limiting amplifier stages 24 is now determined by the settling time requirements of the logarithmic amplifier and not by the carrier frequency of the waveform signal. In the prior art, amplifier gain bandwidth restrictions were serious shortcomings to the architecture, because the aggregate gain of the individual amplifier stages determines the dynamic range of the detector. To achieve high performance in a multi-mode environment, adequate gain must be maintained not only at GSM frequencies but also at PCS frequencies. This is not an issue with the architecture described in the instant invention because in all cases the envelope information of the waveform signal is translated down to baseband. Further, this invention has the additional benefit that the 'ripple' in the amplified current output signal 29 is reduced when compared to the prior art. This is because the narrow bandwidth gain stages 24 and the voltage-to-current converter stages 26 will progressively filter out the harmonic components arising from the process of full-wave rectification.

In summary, without intending to limit the scope of the invention, a logarithmic amplifier according to an apparatus and method consistent with certain embodiments of the invention can be carried out by rectifying a waveform signal to a DC component and then passing the rectified signal through a chain of limiting amplifiers. At each amplification stage, the signal is converted from a voltage signal to a current signal, and each of the current signals are summed to provide amplified current output signal. Because the envelope fluctuations (and therefore the average power) output from the PA are independent of the carrier frequency, translating the envelope information down to baseband frequencies prior to application of the successive compression amplifier chain provides improvements not realized in the prior art. While the invention has been described in conjunction with specific embodiments, it is evident that many alternatives, modifications, permutations and variations will become apparent to those of ordinary skill in the art in light of the foregoing description. Accordingly, it is intended that the present invention embrace all such alternatives, modifications and variations as fall within the scope of the appended claims.

What is claimed is:

1. A demodulating logarithmic amplifier, comprising:
   a full wave rectifier, having an input for receiving a waveform signal and an output for providing a rectified signal that is proportional to an envelope of the waveform signal;
   a plurality of serially coupled amplifier stages, each having an input and an output, wherein the input of a first amplifier stage is coupled to the full wave rectifier to receive the rectified signal;
   a plurality of voltage-to-current converters, each having an input and an output, the input coupled to an output of a respective one of the plurality of serially coupled amplifier stages;
   wherein the outputs of each of the plurality of voltage-to-current converters are coupled together; and
   wherein the values of at least two or more of the plurality of voltage-to-current amplifiers are not identical.

2. The demodulating logarithmic amplifier as described in claim 1, further comprising a voltage-to-current converter having an input coupled to the output of the full wave rectifier, and wherein an output of said converter is coupled to the outputs of each of the plurality of voltage-to-current converters.

3. The demodulating logarithmic amplifier as described in claim 1, wherein the full wave rectifier comprises a linear full wave rectifier.

4. The demodulating logarithmic amplifier as described in claim 1, wherein the full wave rectifier comprises a squaring cell.

5. The demodulating logarithmic amplifier as described in claim 1, wherein each of the amplifier stages comprises a limiting amplifier stage.

6. The demodulating logarithmic amplifier as described in claim 1, wherein the coupled voltage-to-current output is a logarithmic function of the rectified signal.

7. A demodulating logarithmic amplifier, comprising:
   means for rectifying, having an input for receiving a waveform signal and an output for providing a rectified signal that is proportional to an envelope of the waveform signal;
   a first means for amplifying the rectified signal, coupled to the output of the means for rectifying;
   first converting means, coupled to the first means for amplifying, for converting the amplified signal from voltage to current;
   second through Nth means for amplifying, where N is an integer greater than 2, serially coupled to the first means for amplifying and to each other;
   second through Nth converting means, where N is an integer greater than 2, coupled to the respective second through Nth means for amplifying, for converting the respective amplified signals from voltage to current;
   means for summing all of the converted current signals to provide an amplified current output, and;
   wherein the value of the first converting means is not identical to a value of one or more of the second through Nth converting means.

8. The demodulating logarithmic amplifier as described in claim 7, further comprising an additional converting means having an input coupled to the output of the means for rectifying and having an output coupled to the means for summing, for converting the rectified signal from voltage to current.

9. The demodulating logarithmic amplifier as described in claim 7, wherein the means for rectifying comprises a linear full wave rectifier.

10. The demodulating logarithmic amplifier as described in claim 7, wherein the means for rectifying comprises a squaring cell.

11. The demodulating logarithmic amplifier as described in claim 7, wherein each of the means for amplifying comprises a limiting amplifier stage.

12. The demodulating logarithmic amplifier as described in claim 7, wherein each of the means for converting comprises a voltage-to-current converter.

13. The demodulating logarithmic amplifier as described in claim 7, wherein the amplified current output is a logarithmic function of the rectified signal.

* * * * *